(12) United States Patent
Fakhry

(10) Patent No.: US 6,272,671 B1
(45) Date of Patent: Aug. 7, 2001

(54) EXTRACTOR AND SCHEMATIC VIEWER FOR A DESIGN REPRESENTATION, AND ASSOCIATED METHOD

(75) Inventor: Nader Fakhry, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/151,900

(22) Filed: Sep. 11, 1998

(51) Int. Cl.[7] .................................................. G06F 17/10
(52) U.S. Cl. ..................................................... 716/18; 716/3
(58) Field of Search ..................... 716/18, 11, 2, 716/4, 3

(56) References Cited

U.S. PATENT DOCUMENTS

| | | | |
|---|---|---|---|
| 4,831,543 | 5/1989 | Mastellone ................................ | 716/2 |
| 4,922,432 | 5/1990 | Kobayashi et al. ...................... | 716/17 |
| 5,038,294 | 8/1991 | Arakawa et al. ........................ | 716/12 |
| 5,084,824 | 1/1992 | Lam et al. ............................... | 716/11 |
| 5,301,318 | * 4/1994 | Mittal . | |
| 5,384,710 | 1/1995 | Lam et al. ............................... | 716/11 |
| 5,446,675 | 8/1995 | Yoshimura .............................. | 716/11 |
| 5,548,524 | 8/1996 | Hernandez et al. ..................... | 716/12 |
| 5,586,047 | 12/1996 | Imahashi ................................. | 716/18 |
| 5,712,794 | 1/1998 | Hong ....................................... | 703/14 |
| 5,727,187 | 3/1998 | Lemche et al. ......................... | 716/18 |
| 5,867,399 | * 2/1999 | Rostoker et al. ...................... | 364/489 |
| 5,903,469 | * 5/1999 | Ho ..................................... | 395/500.07 |
| 5,995,730 | * 11/1999 | Blinne ..................................... | 716/4 |
| 5,999,726 | * 12/1999 | Ho ....................................... | 395/500.6 |
| 6,028,991 | * 2/2000 | Akashi ............................ | 395/500.15 |

* cited by examiner

Primary Examiner—Matthew Smith
Assistant Examiner—Vuthe Siek

(57) ABSTRACT

A program translates an EDIF netlist that defines a circuit into a data file containing a predetermined subset of the circuit-defining data. The program operates on netlists that define designs and library cells. The data file is useful to describe the circuit, or a portion of the circuit, in a simpler and more intuitive format, so that users unfamiliar with the circuit or with EDIF format can quickly understand the circuit components and connectivity. The subset of circuit data is parsed out of the EDIF netlist and stored in the data file. The data file is useful for extracting and clearly describing the instances connected to a specified signal. The data file is also useful for generating a graphical or textual display of the circuit. A user may specify primary ports, signals, global ports, and cell instances to focus the subset of circuit data on the portion of the circuit of interest. Signals may be traced on a graphical display. Another program can create an EDIF netlist from the data file. Methods for extracting and formatting this data receive command line or interactive input from a user.

28 Claims, 17 Drawing Sheets

EXTRACTOR AND SCHEMATIC VIEWER FOR A DESIGN REPRESENTATION, AND ASSOCIATED METHOD

BACKGROUND OF THE INVENTION

1. Field of the Invention

The present invention pertains generally to electrical computers and more particularly to program products and methods for extracting and graphically or textually representing electronic circuit components and connections.

2. Description of Related Art

Modern electronic chip designers commonly employ circuit design representations to design and simulate electronic circuits. A traditional method of generating such design representations required circuit designers to connect logic symbols representing logic cell instances to specify a circuit design. Typically, a designer selected and placed the logic cell instances in a virtual design representation on a computer screen. The designer could then indicate connections between various logic cells by "drawing" lines connecting such logic symbols on the computer screen. The graphical representation of the design is referred to as a "circuit schematic". Furthermore, a non-graphical design representation may be generated from the schematic, including textual netlists and binary design databases. A netlist is typically a list of electronic logic cells with a description of the interconnections between the inputs and the outputs of the various logic cells instances. A popular netlist format is Electronic Design Interchange Format (EDIF), described in "Designer's Guide to EDIF", E. Marx et al., EDN 1987, and specified in "EDIF Electronic Design Interchange Format Version 200", ANSI/EIA Standard 548, specifically incorporated herein by reference for all that they teach and disclose. Generally, EDIF is a standardized netlist format, which has a LISP-like syntax and is intended to simplify data transfer between CAD/CAE systems.

A microelectronic circuit designer typically combines logic cells from a logic cell library to achieve the desired functionality in a circuit. A logic "cell" in the logic cell library can be defined by an EDIF netlist containing a cell model that specifies structural, functional and timing information. The cell model is typically defined, at least in part, by one or more "primitives". A primitive is a standard logic model, defined by a simulator vendor, that describes a fundamental logic block understood by a simulator (e.g., NAN2, AND2, etc.). A cell model designer uses primitives to develop a set of standard library cells for use by circuit designers. For example, a cell model designer might define an AND4 (i.e., a four input AND gate) library cell to comprise three AND2 (i.e., a two input AND gate) primitives. When a circuit design containing the AND4 cell is instantiated in a design and simulated, the simulator understands the operation of the AND4 based on its three AND2 primitives.

When a library cell is included (or instantiated) in a design, a "cell instance" is created in the design, which may also be defined by an EDIF netlist. A "design" refers to the hierarchical levels in a circuit design and typically includes a combination of component "cell instances" and/or "primitive instances". Each component cell instance may also include a combination of other cell instances and primitive instances. A single cell may be instantiated in a design multiple times, and each cell instance is typically given a unique identifier. Because an EDIF netlist may be hierarchical (i.e., represent many layers of circuitry), the unique identifier for the cell instance often includes a path name for defining the cell instance within the design hierarchy.

The circuit design terms used above may be analogized to a computer directory structure. The root computer directory is analogous to the "top" level of a circuit design hierarchy. In addition, a computer directory structure can have multiple layers of sub-directories within sub-directories. Likewise, an EDIF netlist for a design can have cell instances within cell instances (i.e., the design hierarchy). An individual sub-directory is typically defined by a unique directory path name; an individual cell instance is defined by a unique instance path name. A sub-directory may possess both files that terminate the directory path or subdirectories; a cell instance may possess both primitives that terminate the design hierarchy path or other cell instances.

Generally, the hierarchical nature of the EDIF format, its LISP-like syntax, and the inherent complexity of many circuit designs combine to form an EDIF netlist that is very complicated and difficult for a human to read, unless the user is very familiar with the design or experienced with the EDIF format. Accordingly, a need exists to simplify or translate the EDIF design representation to allow an EDIF-novice or a designer who is unfamiliar with a particular design to quickly understand the design, without requiring a detailed analysis of the EDIF netlist itself.

SUMMARY OF THE INVENTION

It is therefore an object of the present invention to provide a simplified representation of a design using translation of a netlist or other design representation.

It is another object of the present invention to extract specific instance and connectivity information from a design representation and to graphically or textually represent it in user-readable format.

It is yet another object of the present invention to generate a graphical schematic of a circuit by extracting cell instances, primary ports, component instances, component ports, and signal information from a netlist or other design representation.

It is yet another object of the present invention to generate an EDIF netlist of a library cell from a simplified data file.

Additional objects, advantages, and novel features of the invention are set forth in the description that follows and will become more apparent to those skilled in the art when taken in conjunction with the accompanying drawings. The objects and advantages of the invention may be realized and attained by means of the instrumentalities and accommodations particularly pointed out in the appended claims.

To achieve the foregoing and other objects, in accordance with the purposes of the present invention, as embodied and broadly described herein, the program storage medium of this invention may comprise instructions for locating the circuit in said design representation; extracting from the design representation a predetermined subset of data defining the circuit; formatting the predetermined subset of circuit data into a user-readable format including at least one element having a component instance name, a component celltype, a component port name, and a signal name; and outputting the predetermined subset of circuit data in the user-readable format.

The present invention may also comprise, in accordance with its object and purposes, a method having the steps of locating the circuit in the design representation; extracting from the design representation a predetermined subset of data defining the circuit; formatting the predetermined subset of circuit data into a user-readable format including at least one element having a component instance name, a component celltype, a component port name, and a signal name; and outputting the predetermined subset of circuit data in the user-readable format.

DETAILED DESCRIPTION

Figure 1:
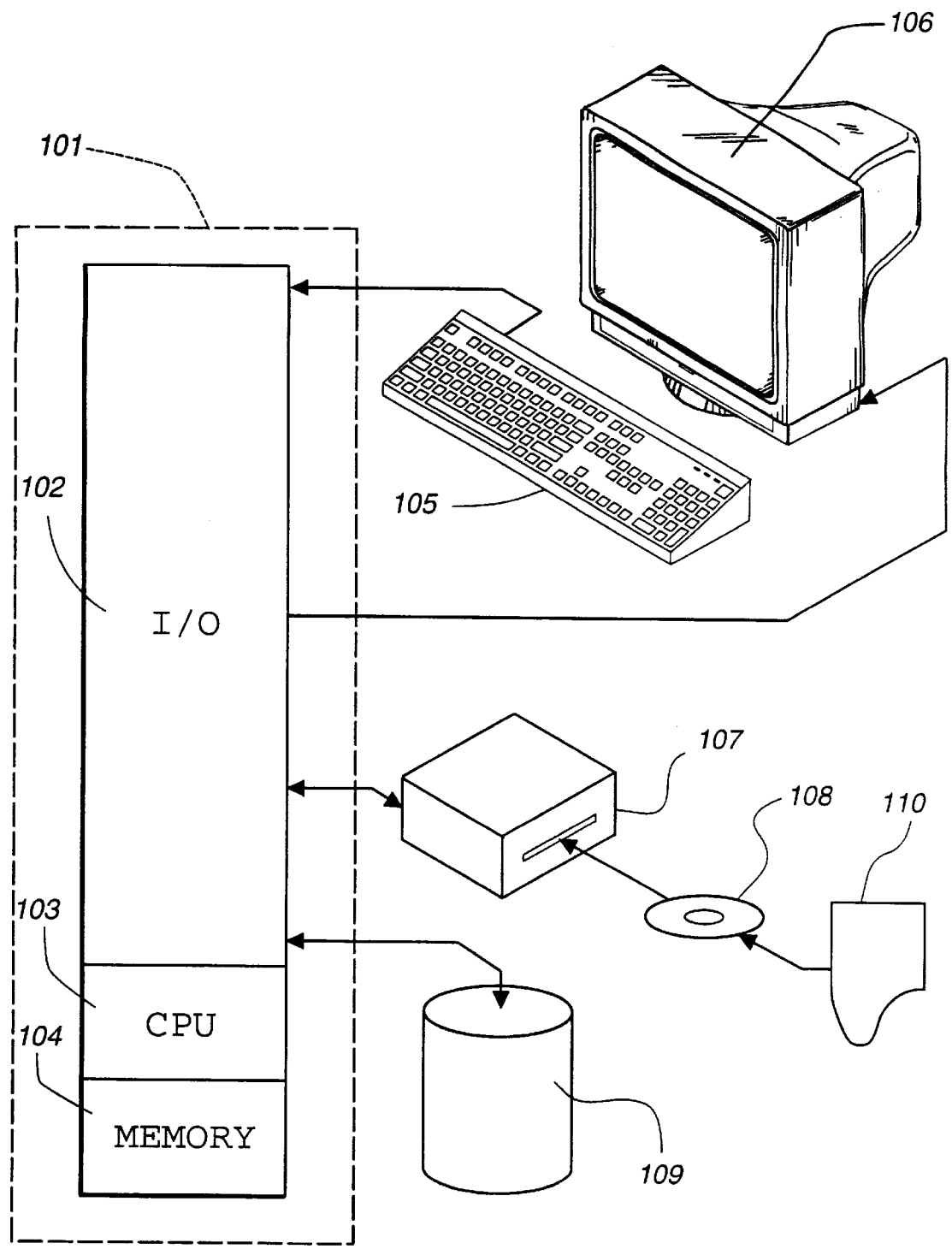
FIG. 1 depicts a general purpose computer useful for implementing an exemplary embodiment of the present invention.

One operating environment in which the present invention is potentially useful encompasses the general purpose computer. In such a system, data and program files may be input to the computer, which reads the files and executes the programs therein. Some of the elements of a general purpose computer are shown in FIG. 1, wherein a processor 101 is shown having an input/output (I/O) section 102, a Central Processing Unit (CPU) 103, and a memory section 104. The present invention is optionally implemented in software devices loaded in memory 104 and/or stored on a configured CD-ROM 108 or storage unit 109 thereby transforming the computer system in FIG. 1 to a special purpose machine for implementing the present invention.

The I/O section 102 is connected to keyboard 105, display unit 106, disk storage unit 109, and disk drive unit 107. Generally, in contemporary systems, the disk drive unit 107 is a CD-ROM driver unit capable of reading a CD-ROM medium 108, which typically contains programs 110 and data. Computer program products or circuit models containing mechanisms to effectuate the apparatus and methods in accordance with the present invention may reside in the memory section 104, on a disk storage unit 109, or on the CD-ROM medium 108 of such a system. Alternatively, disk drive unit 107 may be replaced by a floppy drive unit, a tape drive unit, or other storage medium drive unit. Examples of such systems include SPARC systems offered by Sun Microsystems, Inc., personal computers offered by IBM Corporation and by other manufacturers of IBM-compatible personal computers, and other systems running a UNIX-based or other operating system. In accordance with the present invention, software program modules, such as programs under test, a test shell, and a test client, may be executed by CPU 103, and test case data elements and other data may be stored on disk storage unit 109, disk drive unit 107 or other storage medium drive units coupled to the system.

Figure 2:
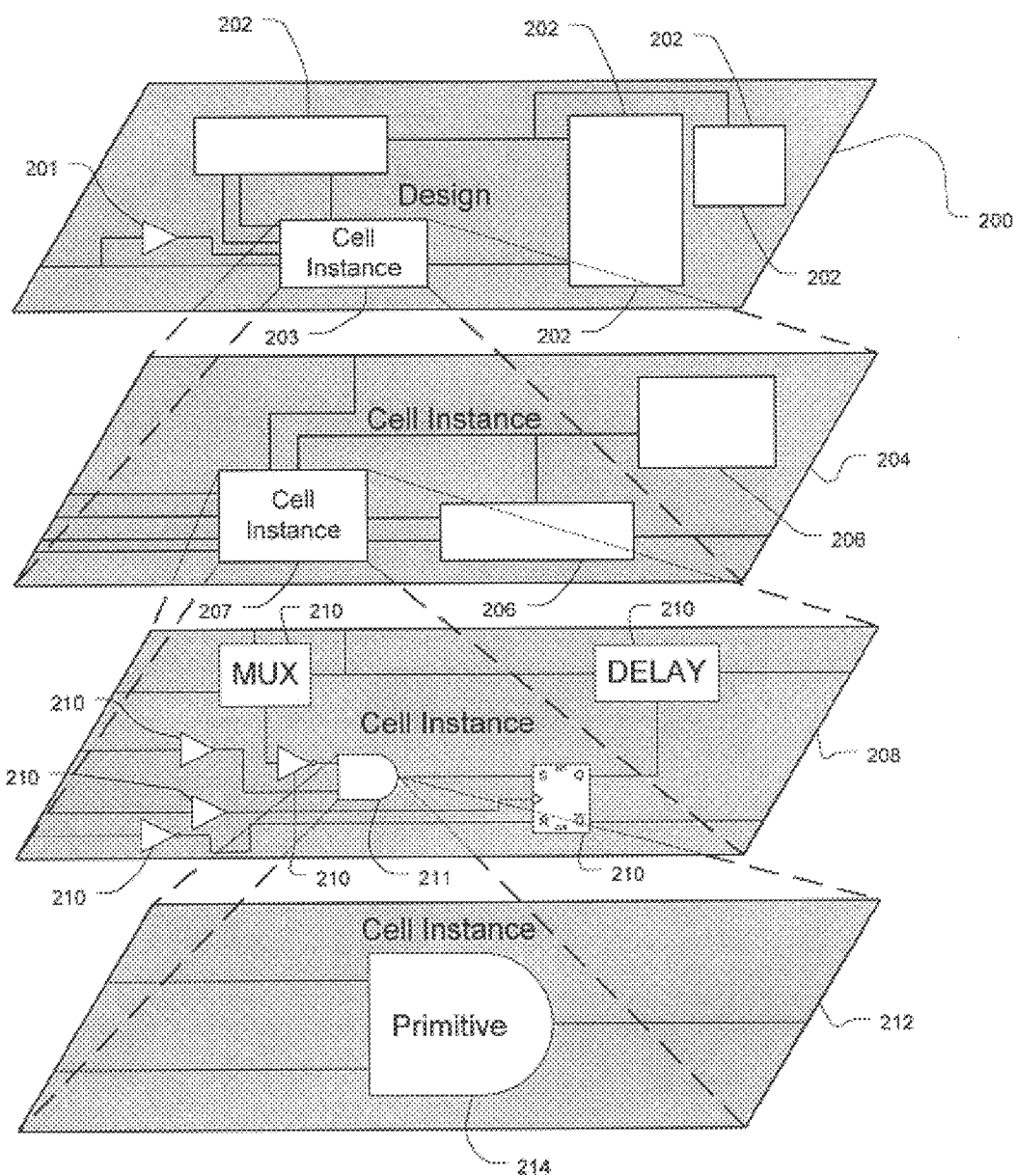
FIG. 2 depicts various hierarchical levels of a circuit design in accordance with the present invention.

FIG. 2 illustrates terms used to describe EDIF-based technology in this specification. Plane 200 illustrates the top level of a circuit design. The term "cell instance" refers to a functional component instantiated in a design, such as a logic cell (i.e., a logic "cell" selected from a standard cell library and instantiated in the design) or a defined grouping of logic cells instances"". As such, the components shown as 201, 202, and 203 of plane 200 are "cell instances. In addition, a cell instance may also include primitives (not shown in plane 200).

Plane 204 represents an expanded view of cell instance 203, which comprises cell instance 207 and two other cell instances 206. Cell instance 203 may also include primitives (not shown in plane 204). Plane 208 illustrates an expanded view of cell instance 207 in a third level of hierarchy. Cell instance 207 comprises cell instance 211 and seven other cell instances 210. Cell instance 207 may also include primitives (not shown in plane 208). Plane 212 illustrates an expanded view of cell instance 211, which is modeled by primitive 214. Primitive 214 is a standard logic model that defines the functionality of cell instance 211. Cell instance 211 is an instantiation of a special type of cell (a "library cell") because it is defined in a standard cell library and is defined only by one or more primitives.

An EDIF file for the design of plane 200 would generally include EDIF CELLNAME entries for the cell instance of plane 200 and the cell instances 202, 203, 206, 207, and any non-library cell instances existing under cell instances 202 and 206. The EDIF file would not include CELLNAME entries for "library cell instances", such as library cell instances 201, 210 and 211, although these library cell instances would be specified as component cell instances inside a CELLNAME entry of a non-library cell instance. A CELLNAME entry for a cell instance includes a list of component cell instances or primitives at the next lower level of hierarchy within the cell instance. For example, in the EDIF netlist for the design of plane 200, the CELLNAME entry at the top level of the design would include a separate list of component cell instances 201, 202, and 203. Likewise, an EDIF file would also include a CELLNAME entry for cell instance 203, comprising a list of component cell instances 207 and 206. Furthermore, the CELLNAME entry for cell instance 207 would include a list of component cell instances 210 and 211. In this manner, all non-library instances would have CELLNAME entries.

In contrast, cell instances 201, 210 and 211, which are library cell instances, would not have CELLNAME entries in the EDIF file for the design of plane 200. Instead, the CELLNAME entries for all library cells instantiated in the design are stored in a separate technology file ("TechFile"). If a library cell is not instantiated in a design, then it does not have a CELLNAME entry in the TechFile. Furthermore, a library cell has only one CELLNAME entry in the TechFile, regardless of how many times that library cell is instantiated in the design. In addition, each library cell that exists in the standard cell library is defined in individual EDIF files stored in a predetermined directory tree.

Figure 3:
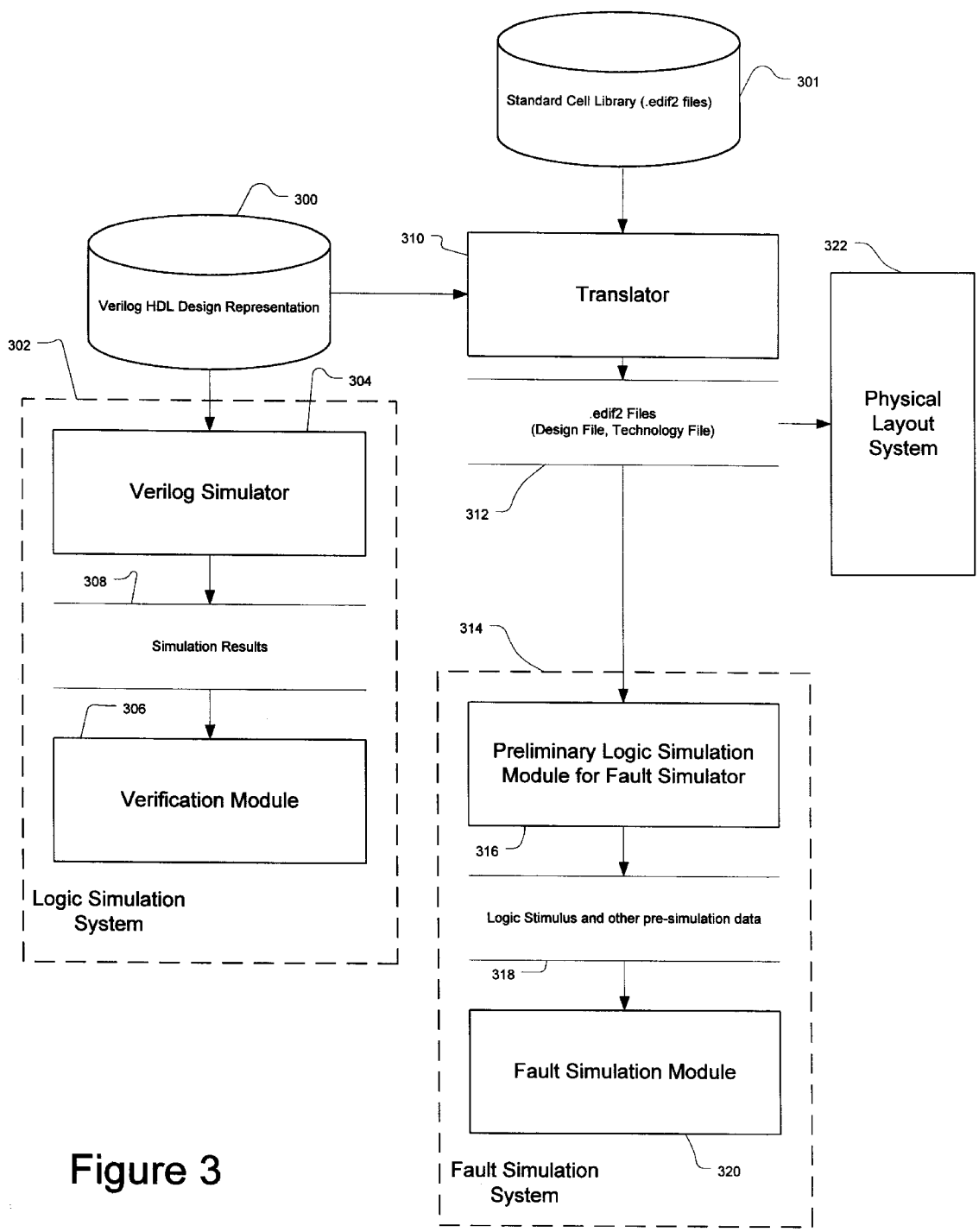
FIG. 3 depicts a portion of a circuit design flow involving both logic simulation and fault simulation in accordance with the present invention.

FIG. 3 illustrates an exemplary design environment in which an embodiment of the present invention may be used. Verilog HDL design representation 300 defines the functionality of a circuit design. The functionality of the design is defined as a combination of logic cell instances. Logic simulation system 302 preferably comprises Verilog simulator 304 and verification module 306. Verilog simulator 304 receives design representation 300 as input. Verilog simulator 304 also receives other input files required for simulation, including an input stimulus file (not shown). The input stimulus file defines the input signal timings and states used to drive the circuit during simulation.

Simulation results 308 represent the results of the simulation, typically in a data file. Generally, simulation results are output signal states and timings that are generated from the simulated operation of the circuit during simulation. Simulation results 308 are input to verification module 306 and compared with a set of expected results (not shown). Generally, a designer may perform multiple simulations (i.e., loops) within the logic simulation system 302 until the simulation produces the proper expected results. Each loop may involve modifications to the design representation 300 or to other accompanying files including the input stimulus file or the expected result file.

Translator 310 receives verilog design representation 300 as an input file and translates the design representation into two EDIF files 312. The first EDIF file is referred to as a "design file", which includes EDIF CELLNAME entries for each non-library cell instance in the design. The EDIF file for the design does not include CELLNAME entries for instances of library cells. Instead, the technology file contains a single EDIF CELLNAME entry of each type of standard library cell instantiated in the design. For example, if a design includes multiple instances of a NAN2 cell, the design file would specify all such cell instances within the design description, typically in the component cell instance list of one or more CELLNAME entries. The technology file, however, would include only one CELLNAME entry for the NAN2 cell. The EDIF files 312 may be input to the physical layout system 322 for such operations as routing and mask generation.

Fault simulation system 314, preferably a Zycad fault simulator system, is a simulator system that evaluates the test coverage achieved by a particular input stimulus set for a particular circuit design. Test coverage relates to the percentage of internal circuit paths and signal states that can be satisfactorily tested in an Automated Test Equipment (ATE) system. Generally, ATE systems test a manufactured circuit device by providing input signals to the device and evaluating the resulting output signals sensed on the output pins of the device. Accordingly, a fault simulator system determines the percentage of internal states and paths that are tested by the specified input stimulus and that are detectable by the monitored output signals.

Preliminary logic simulation module 316 generates logic stimulus, calculates delays, translates the circuit into Zycad input format, and performs other preliminary operations. The results of module 316 are output as data 318, which are used by the fault simulator module 320 to perform fault simulation. Typically, the logic simulation is performed by the designer in the course of designing and verifying the circuit operation. The designer is likely to be familiar with the circuit and with EDIF netlist format. Alternatively, the fault simulation may be performed by someone other than the designer who is less familiar with the design and with the EDIF netlist format. When the individual performing the fault simulation detects an error in the fault simulation, the inherent difficulty in debugging the problem is compounded by the individual's lack of familiarity with the design and by the complexity of the EDIF format. Accordingly, a translator module that extracts specific information from an EDIF netlist provides a simplified, user-readable output format would be useful to such an individual.

Figure 4:
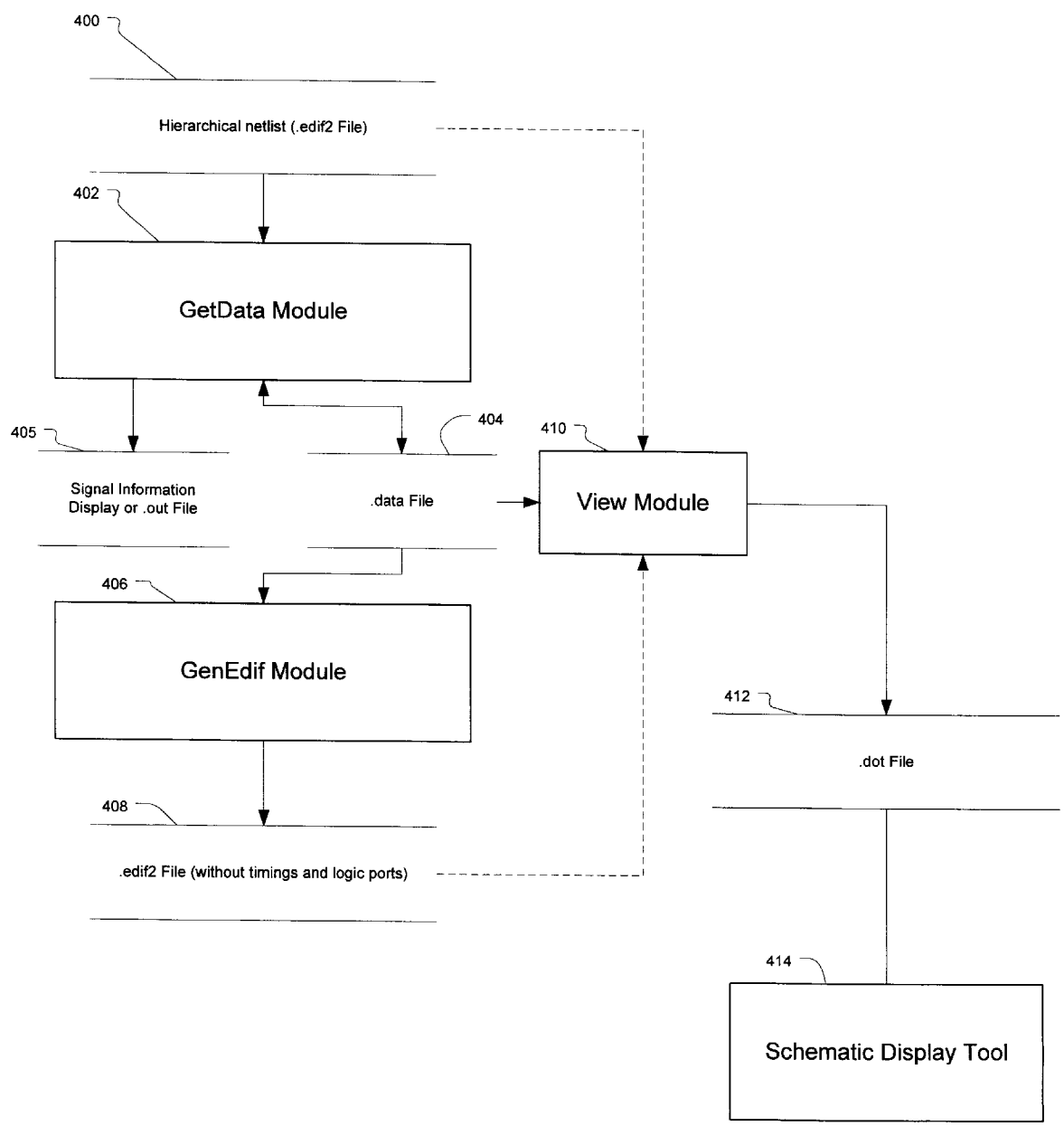
FIG. 4 depicts a system in accordance with the present invention in accordance with the present invention.

In FIG. 4, GetData module 402 receives a hierarchical netlist in EDIF format. A selectable output of GetData module 402 is .data file 404. Alternatively, a user may select to receive signal information 405 in a .out file, on a display screen, or via another standard output device. The .data file 404 presents a user with a simple description of the component cells instances contained in netlist 400. Furthermore, port instances on component cell instances, and interconnections between such component cell instances and modules are also described in .data file 404. GenEdif module 406 can receive a .data file 404 and generate an EDIF format netlist 408 that lacks timing information.

View module 410 receives input from data file 404 and one of EDIF file 400 or EDIF file 408. View module 410 allows a user to look at a graphical representation of a cell specified in data file 404 and a corresponding EDIF file, EDIF file 400 or EDIF file 408. To display this graphical representation of the cell, View module 410 generates a .dot file 412 and then initiates a schematic display tool 414. In an exemplary embodiment in accordance with the present invention, schematic display tool 414 is the dot tool, version 92c Aug. 11, 1993 from AT&T Bell Labs. The dot tool is specified in detail in Eleftherios Koutsofios & Stephen C. North, "Drawing Graphs with dot", AT&T Bell Laboratories, Murray Hill, N.J. View module 410 generates a .dot file and calls the dot tool to display a graphical representation of the specified information. View module 410 allows a user to view, in part or in full, the primitives and interconnections within a cell or cell instance. Using this system, an inexperienced or uninitiated user may quickly and simply extract the necessary information to understand the structure and function of a cell or design.

Figure 5:
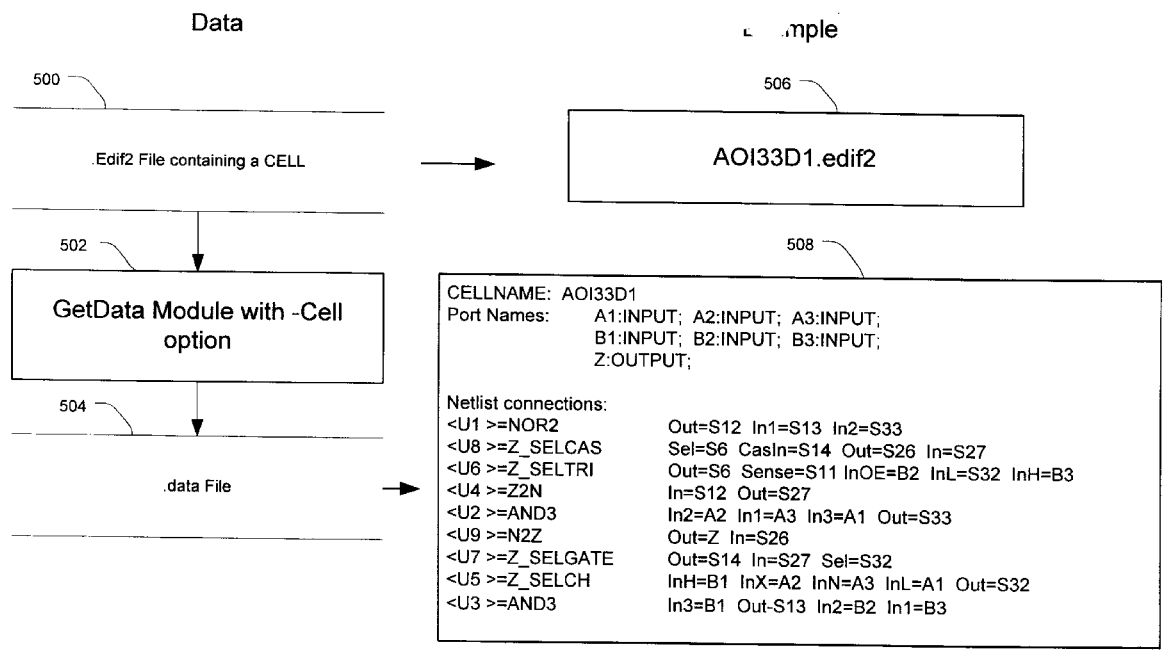
FIG. 5 is a data diagram and example of a GetData module executed with a -Cell option in accordance with the present invention.

Using the conventions illustrated in FIG. 2, FIG. 5 is a data diagram and example for a GetData module executed with the -Cell option. The .edif2 file 500 is an EDIF file that contains a cell, preferably defined in a cell library. GetData module 502 is executed with the -Cell option to produce data file 504. The -Cell option causes the GetData module 502 to display the primitive instances, component ports, internal nets, and primary ports of the cell. Primary ports are ports defined on the external boundary of a cell or cell instance, as opposed to component ports, which are ports on component instances within a cell.

The AOI33D1.edif2 file 506 and the .data file 508 are examples of the data received and generated by the GetData module with a -Cell option. The AOI33D1.edif2 506 is an EDIF file (from a cell library) that defines the cell AOI33D1 and is input to the GetData module. The example .data file 508 illustrates the output of GetData module 502, based on the AOI33D1.edif2 file 506. On the first line of .data file 508, a label "CELLNAME" indicates the name of the cell extracted from the AOI33D1.edif2 file 506. On the following line or lines, all primary ports of the AOI33D1 cell and their respective signal directions are indicated. Signal directions may include INPUT, OUTPUT, and INOUT (for bi-directional ports). In .data file 504, all component instances and internal net connections in the cell are listed in elements of the "Netlist connections" section having the following format:

<Instance>=CellType Pin1=Signal1 Pin2=Signal2 Pin3=Signal3

The "Instance" place holder refers to the name of the component instance in the cell, as it is described in the .edif2 file. The "CellType" place holder is name of the primitive or cell embodied by the component instance. "Pin1", "Pin2", and "Pin3" refer to component port instances on the component cell instance. "Signal1", "Signal2", and "Signal3" refer to the internal interconnections or signals among the pins of the corresponding component instance, global ports, and the primary ports within the cell. Global ports, such as VSS, VCC, VDD, and GND, may be connected to a pin of a component instance by specifying the global port name in the place of a signal place holder. If a signal is connected to a primary port, the signal is labeled with the name of the primary port. If a signal is connected between component instances, the signal is labeled with an arbitrary name having a prefix "S" followed by an arbitrary number. Other signal labeling methods are also contemplated within the scope of the invention, providing that it is possible to differentiate between individual signals. This format provides a user unfamiliar with EDIF format or the cell design with an easy and intuitive description of the cell.

Figure 6:
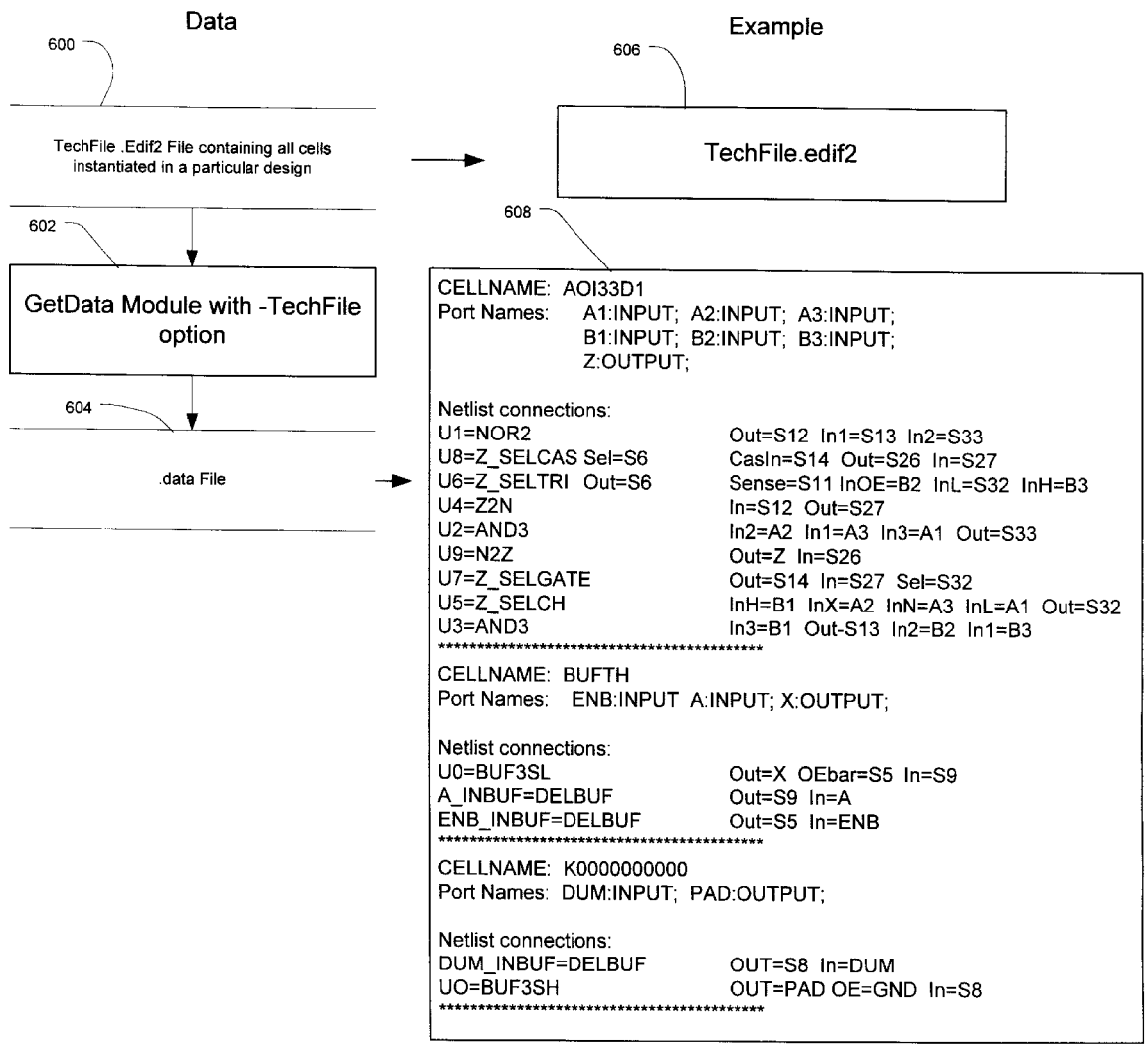
FIG. 6 is a data diagram and example of a GetData module executed with a -TechFile option in accordance with the present invention.

FIG. 6 is a data diagram and example for a GetData module executed with the -TechFile option. The .edif2 file 600 is a EDIF-based technology file containing CELLNAME entries for library cells instantiated in a design. For example, if a design included 8 NAN2 library cell instances, an INV library cell instance, and 12 NOR2 library cell instances, the technology file would contain a NAN2 cell entry, an INV cell entry, and a NOR2 cell entry. If GetData module 602 is executed with the -TechFile option, the resulting .data file 604 contains simplified descriptions for each type of library cell in the EDIF-based technology file, including the corresponding component instances, internal nets, and primary ports.

The TechFile.edif2 file 606 and the .data file 608 are examples of the data received and generated by the GetData module with a -TechFile option. TechFile.edif2 606 contains EDIF entries for each type of library cell included in a design. As shown in .data file 608, the technology file contains 3 library cells: an AOI33D1, a BUFTH, and a K0000000000. Accordingly, a user can refer to the .data file 608 to learn about the individual types of library cells that exist in a design. On the first line of .data file 608, a label "CELLNAME" indicates the name of the library cell that was extracted from the .edif2 technology file 606. On the following line or lines, all primary ports for the library cell and their signal direction are indicated. Signal directions may include INPUT, OUTPUT, and INOUT (for bi-directional ports). In .data file 604, all component instances and internal net connections in the cell are listed in elements of the "Netlist connections" section having the following format:

Instance=CellType Pin1=Signal1 Pin2=Signal2 Pin3=Signal3

The "Instance" place holder refers to the name of the component instance in the cell as it is described in the .edif2 file 606. The "CellType" place holder is name of the type of primitive or cell embodied by the component instance. "Pin1", "Pin2", and "Pin3" refer to ports on the component instance. "Signal1", "Signal2", and "Signal3" refer to the internal connections or nets among the pins of the corresponding component instance and/or the primary ports within the cell. This format provides a user unfamiliar with EDIF format or the circuit design with an easy and intuitive description of the library cells instantiated in the design.

Figure 7:
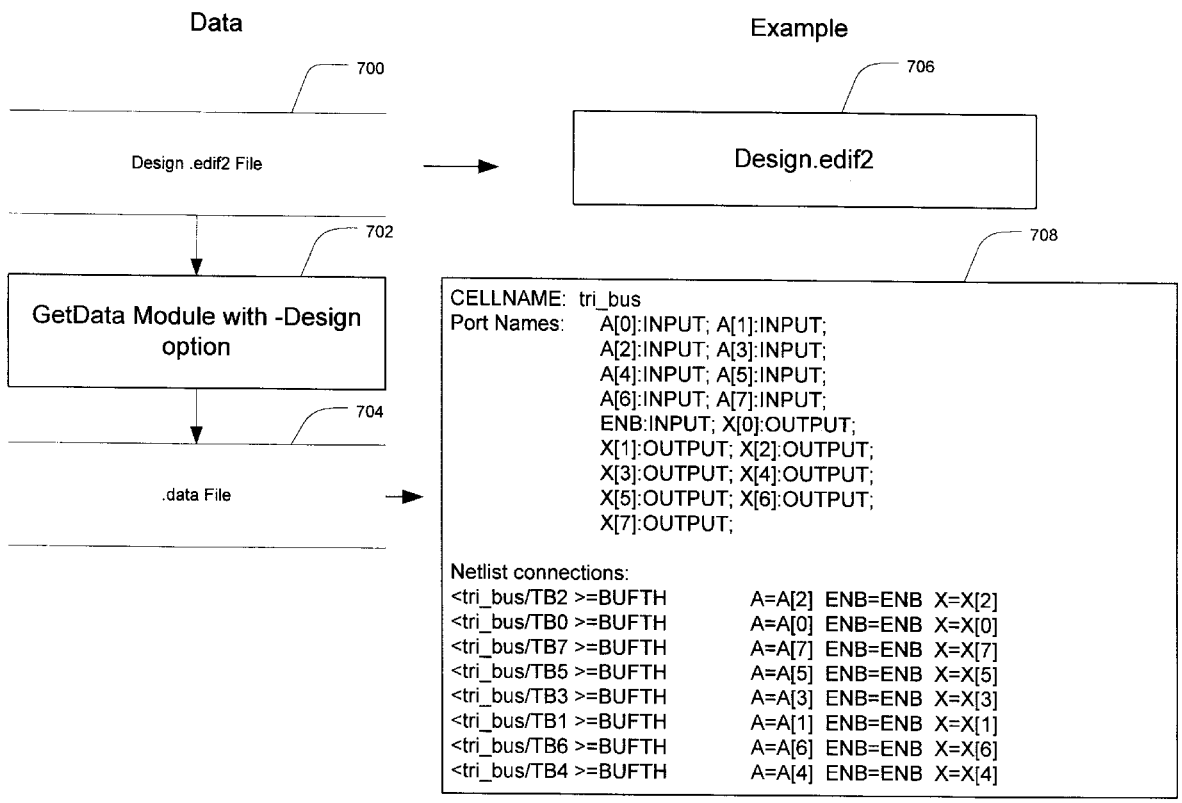
FIG. 7 is a data diagram and example of a GetData module executed with a -Design option in accordance with the present invention.

FIG. 7 is a data diagram and example for a GetData module executed with the -Design option. The .edif2 file 700 is a design netlist in EDIF format containing interconnected CELLNAME entries for all of the non-library cell instances in the design. If the GetData module 702 is executed with the -Design option, .data file 704 is generated for the non-library cell instances in the design. In .data file, 704, all component instances and internal net connections in the cell instance are listed in elements of the "Netlist connections" section having the following format:

<InstancePath>=CellType Pin1=Signal1 Pin2=Signal2 Pin3=Signal3

The "Instance Path" placeholder specifies the path to the component instance. In the example design.edif2 file 706, a single cell instance, named "tri-bus", exists in the top-level of the design. The component cell instances, TB0 to TB7, are comprised of BUFTH library cells. Accordingly, Get-Data module 702 generates a .data file showing the cell instance name for the design, "tri-bus", and the primary ports of the tri_bus cell instance with their associated signal directions. In this example, there are seventeen primary ports on the "tri_bus" instance, 9 inputs and 8 outputs. The 8 component instances, which generally may comprise both non-library cell instances and primitives, are then listed in the "Netlist Connections" section. If the top level cell instance (e.g., tri_bus) contained non-library component cell instances, then additional CELLNAME entries would follow the tri_bus entry within the .data file 708. For this example, all component cell instances are instantiated library cells.

Figure 8:
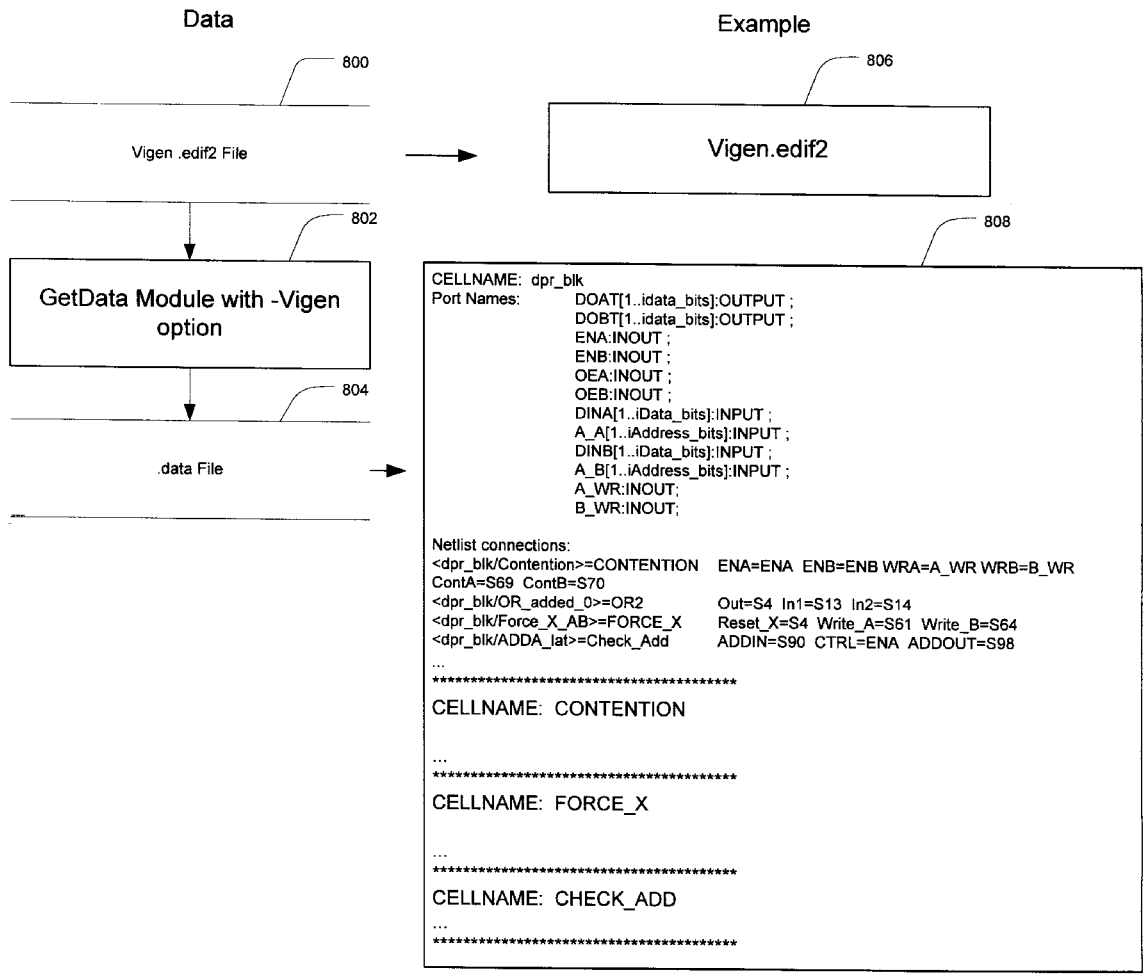
FIG. 8 is a data diagram and example of a GetData module executed with a -Vigen option in accordance with the present invention.

FIG. 8 is a data diagram and example for a GetData module executed with the -Vigen option. The .edif2 file 800 is a netlist file of a Vigen cell. A Vigen cell is a parametrized cell that is generated by a cell generator, such as GDT. Generally, GDT is a layout generation language that takes either predefined cells and/or layout code describing structural placement of cells and stitches the cells together to form the memory or any other functional block. A designer can generate such cells using parameters, such as the dimensions of a memory array or the width of a bus, to define certain features of the resulting cell. If the GetData module 802 is executed with the -Vigen option, .data file 804 is generated from an EDIF file defining a Vigen cell. The Vigen EDIF file is typically in a Vigen cell library directory structure. On the first line of data file 808, a label "CELLNAME" indicates the name of the Vigen cell that was extracted from the .edif2 file 806. On the following line or lines, all primary ports and their signal direction are indicated. Signal directions may include INPUT, OUTPUT, and INOUT (for bi-directional ports). In .data file 804, all component instances and internal net connections in the Vigen cell are listed in elements of the "Netlist connections" section having the following format:

<InstancePath>=CellType Pin1=Signal1 Pin2=Signal2 Pin3=Signal3

The "CELLNAME: dpr_blk" entry is abbreviated in FIG. 8 to simplify the drawing. However, Vigen cells tend to be quite complex and the CELLNAME entry in .data file 808 for the dpr_blk is actually quite extensive. Furthermore, Vigen cells are hierarchical (in contrast to library cells). Therefore, other cell instances, such as CONTENTION, FORCE_X, and CHECK_ADD exist within the dpr_blk cell and are also extracted into .data file 808. Additional non-library cell instances within the dpr_blk Vigen cell would also be extracted into .data file 808. Accordingly, the "Instance Path" placeholder specifies the path to the component instance.

Figure 9:
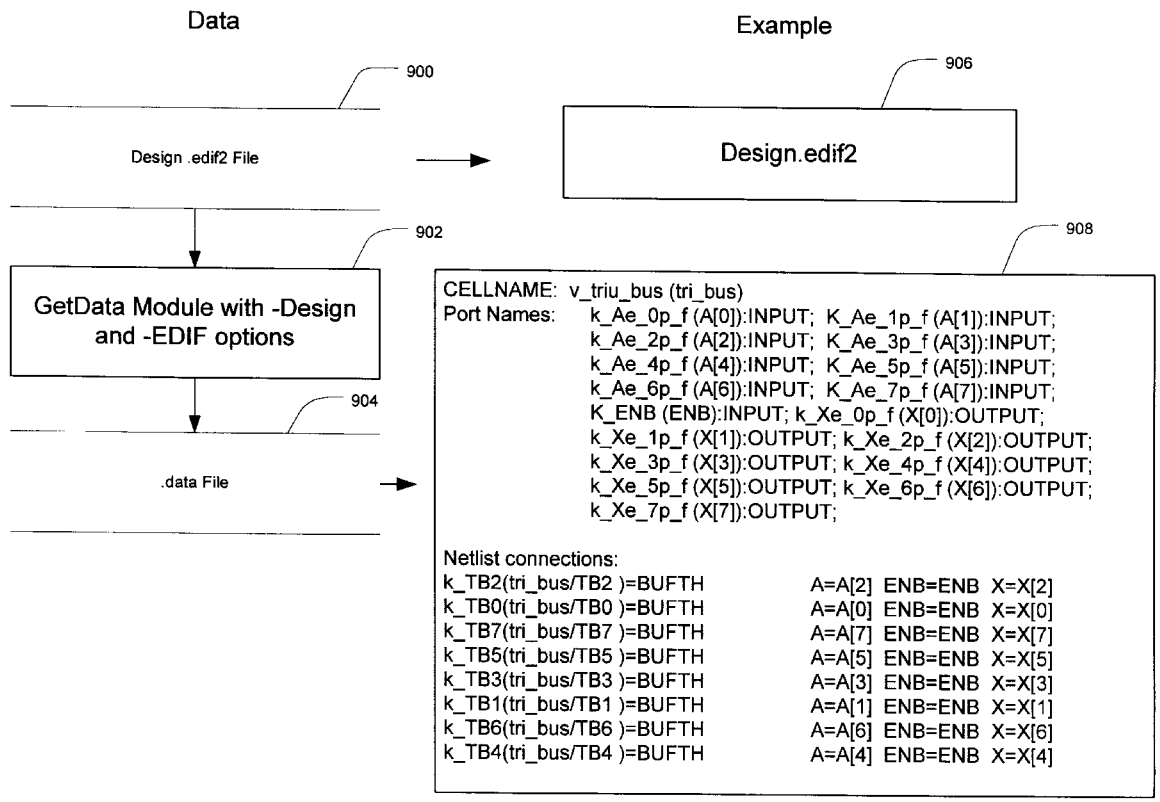
FIG. 9 is a data diagram and example of a GetData module executed with -Design and -EDIF options in accordance with the present invention.

FIG. 9 is a data diagram and example for a GetData module executed with the -Design and -EDIF options. By adding the -EDIF option, GetData module 902 inputs design .edif2 file 900 and extracts both the original Verilog names (real names) and the .edif2 file names for the cell instance, the primary ports, and the component instances, which are typically renamed by the translator (see translator 310 of FIG. 3) that generates the .edif2 file. The real names are displayed in parentheses for these circuit elements, and the translated names are displayed outside the parentheses. Accordingly, the format for the -EDIF data file is:

CELLNAME: RenamedName (RealName)
   Port Names: RenamedPort1 (RealPort1) :SignalDirection1;
   RenamedPort2 (RealPort2):SignalDirection2;
   RenamedPort3 (RealPort3):SignalDirection3;
   Netlist connections:
   RenamedInstance1 (RealInstance1)=CellType CellType Pin1=Signal1 Pin2=Signal2 Pin3=Signal3

Figure 10:
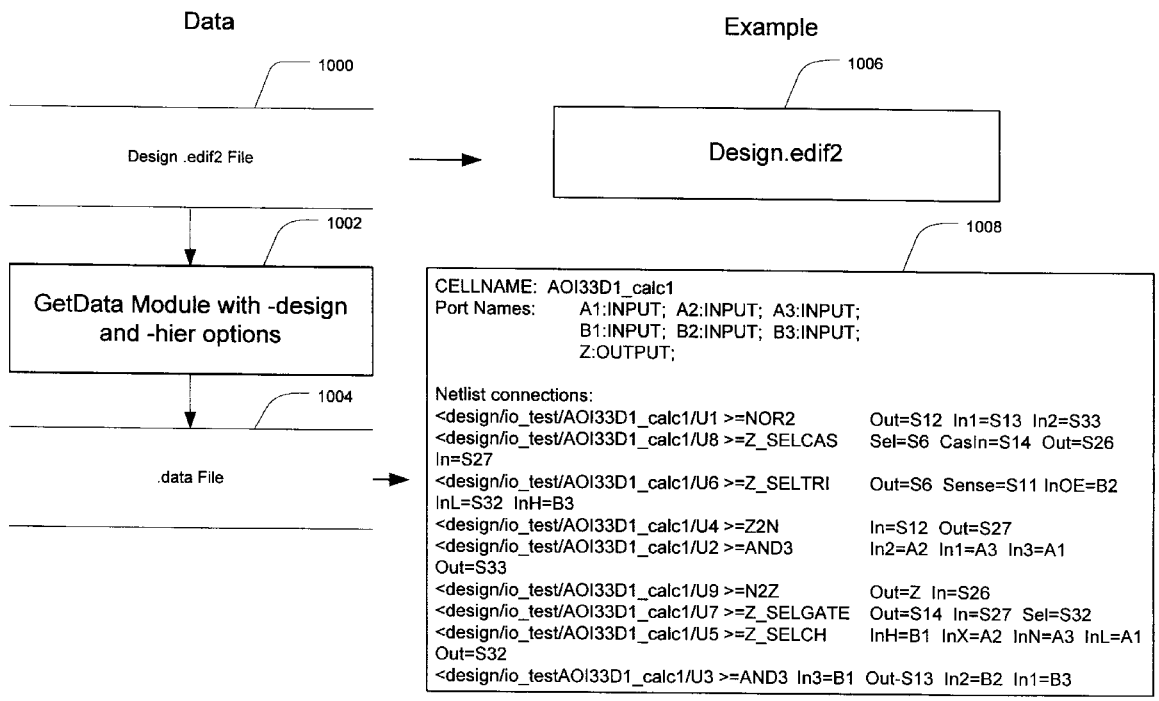
FIG. 10 is a data diagram and example of a GetData module executed with -Design and -Hier options in accordance with the present invention.

FIG. 10 is a data diagram and example for a GetData module executed with the -Design and -Hier options. By adding the -Hier option, GetData module 1002 only extracts the non-library cell instances at or below a specified hierarchical level. The desired hierarchical level is provided in the command line by a path name defining a cell instance name in .edif2 file 1000, and hierarchical levels above or outside of the specified instance name are not extracted into .data file 1004. In an alternate embodiment, only the non-library cell instance specified in the command line, with a list of its component instances, is extracted into .data file 1004.

For example, design.edif2 file 1006 contains many cell instances and levels of hierarchy, including the "design" level and the "io_test" level. However, if GetData module 1002 is executed with the -Hier option, specifying the "design/io_test/AOI33D1_calc1" cell instance name, the design/io_test/AOI33D1_calc1 cell instance and any cells within it are extracted into the .data file. In the example, there are no other non-library cells under the design/io_test/AOI33D1$_{calc}$1 level, so only the design/io_test/AOI33D1_calc1 cell instance is extracted.

Figure 11:
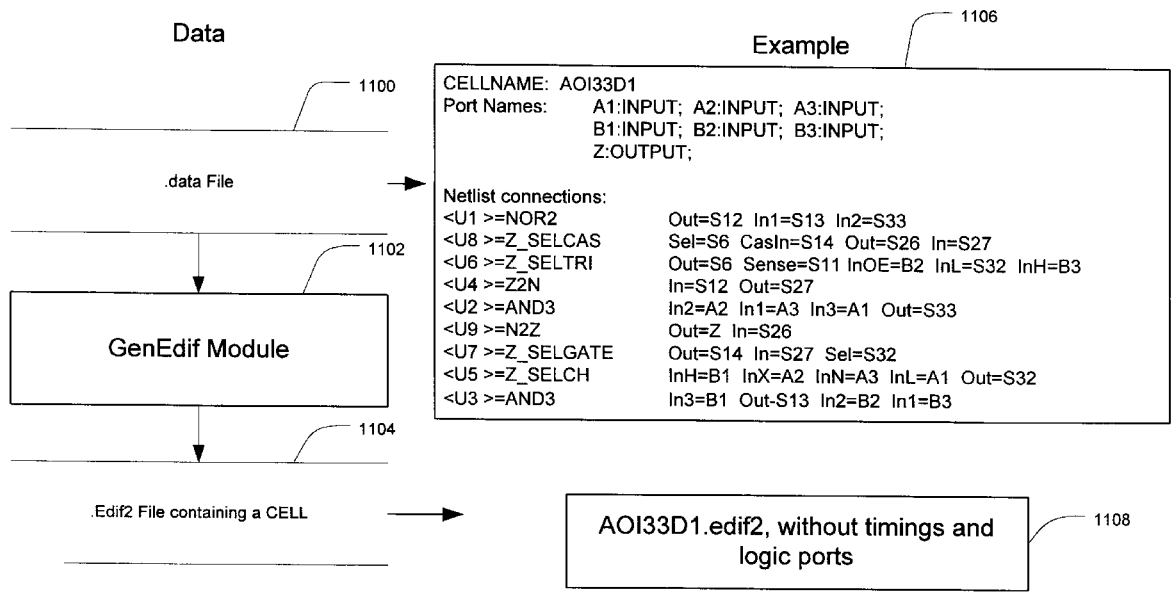
FIG. 11 is a data diagram and example of a GenEdif module executed in accordance with the present invention.

FIG. 11 depicts a data diagram and example for GenEdif module 1102, which creates a EDIF netlist 1104 from .data file 1100. This functionality is useful to a cell model designer who is customizing an existing cell. For example, by extracting a .data file from an AOI33D1 EDIF netlist, the cell model designer is presented with a simplified representation of the cell. Thereafter, the cell model designer can modify the .data file to modify the component cell instances and connectivity to obtain a customized cell. Typically, in comparison to creating an customized EDIF netlist for a new cell or modifying the EDIF netlist of an existing cell, modifying the .data file of an existing is simpler and reduces the risk of mistakes.

In the example in FIG. 11, data file 1106 is input to the GenEdif module to produce EDIF netlist 1108. The data file 1106 could have been created from scratch or initially generated by a GetData module. EDIF netlist 1108 contains only data from the .data file 1106 in EDIF format; therefore, information that does not exist in the .data file, such as timing and logic port data, is not included in the resulting EDIF file. In an alternate embodiment, timing and other required input data is input via another input file; therefore, the resulting EDIF is a complete EDIF netlist of a cell.

Figure 12:
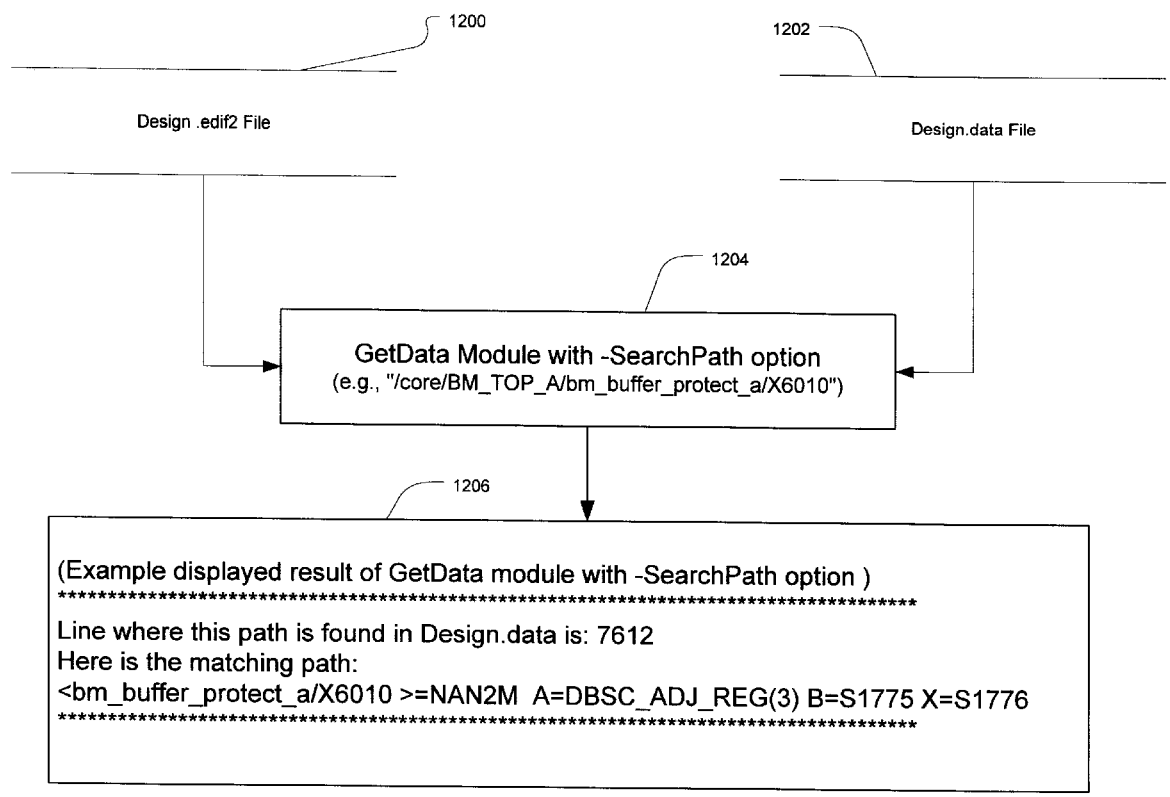
FIG. 12 is a data diagram and example of a GetData module executed with a -SearchPath option in accordance with the present invention.

FIG. 12 depicts a data diagram and example for GetData module 1204 executed with a -SearchPath option. In this mode, GetData module 1204 preferably receives .edif2 file 1200 and data file 1202 as inputs. (Consequently, it is assumed that GetData has already been successfully executed using the -Design option.) In this mode, GetData module 1204 also requires an input parameter specifying the full path name of the cell instance to be located (e.g., "/core/BM_TOP_A/bm_buffer_protect_a/X6010"). The output of GetData module 1204 is sent to a standard output device, preferably to a display. As shown in block 1206 of FIG. 12, the output indicates the line in the .data file in which the specified cell instance is located. The corresponding line is then output. Notice that the resulting path name is not necessarily a full path name from the top level of the design. Instead, the resulting path typically extends only up to the cell instance in the next highest level of the design hierarchy.

Figure 13:
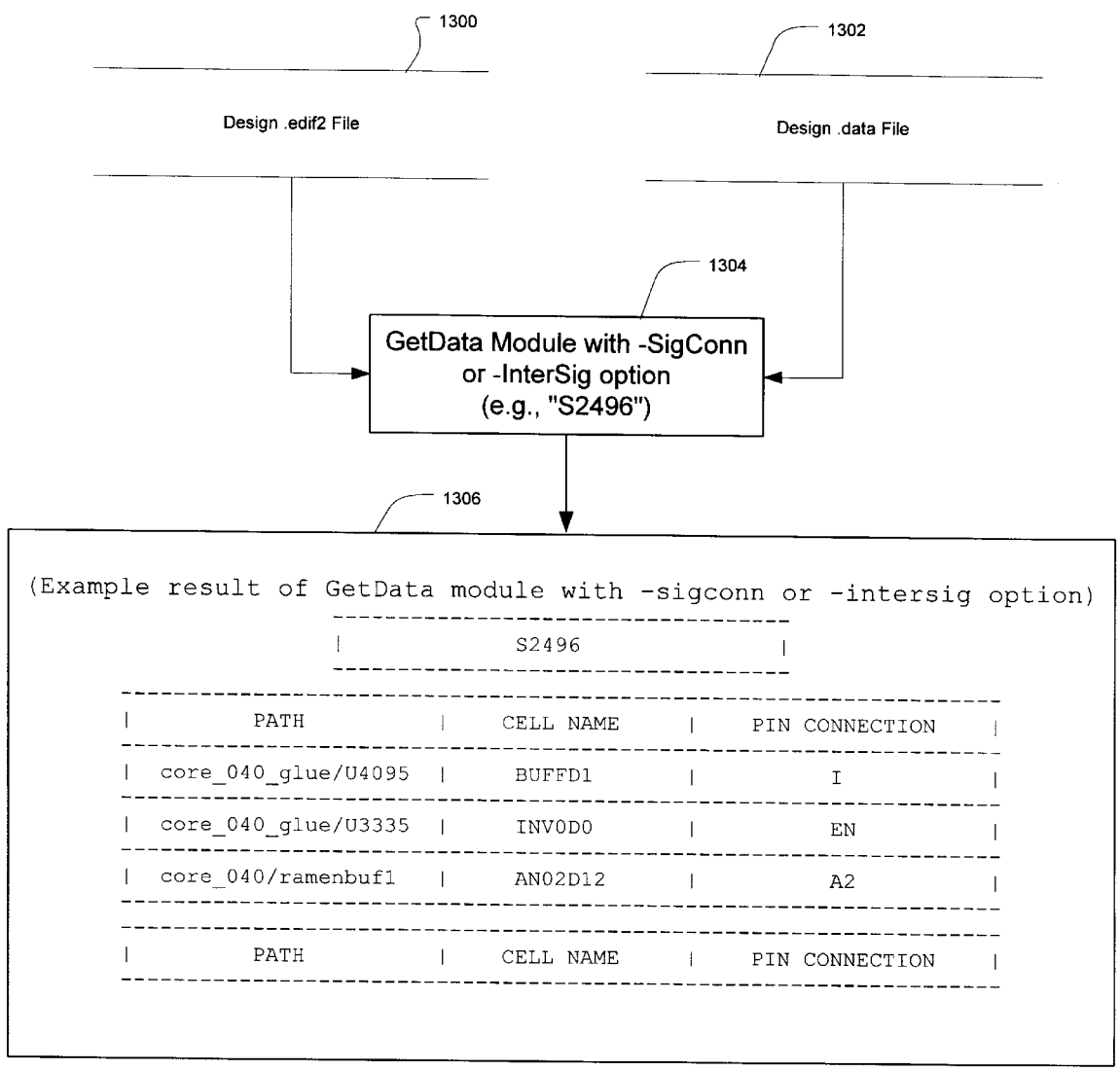
FIG. 13 is a data diagram and example of a GetData module executed with a -SigConn or -InterSig option in accordance with the present invention.

FIG. 13 depicts a data diagram and example for GetData module 1304 executed with either the -SigConn or the -InterSig option. These two modes output the cell instances, primitives, and pin connections (i.e., component ports of the corresponding component cell instance) that are connected to a given signal. In this mode, GetData module 1304 requires .edif2 file 1300 and .data file 1302 as inputs. (Consequently, it is assumed that GetData has already been successfully executed using the -Design option.) The -SigConn option also requires a signal name (e.g., "S2496") as a command line parameter and produces a result in a file having the suffix, ".out" (see block 1306 of FIG. 13).

Alternatively, the -InterSig option provides an interactive interface to allow a user to view simplified displays of signal connections. The -InterSig option requires the user to input a signal name at a prompt, rather than at the command line. The result of the -InterSig mode is output to a standard output device, preferably a display. After the result of a signal name is displayed in -InterSig mode, the user is prompted again for a new signal name.

Figure 14:
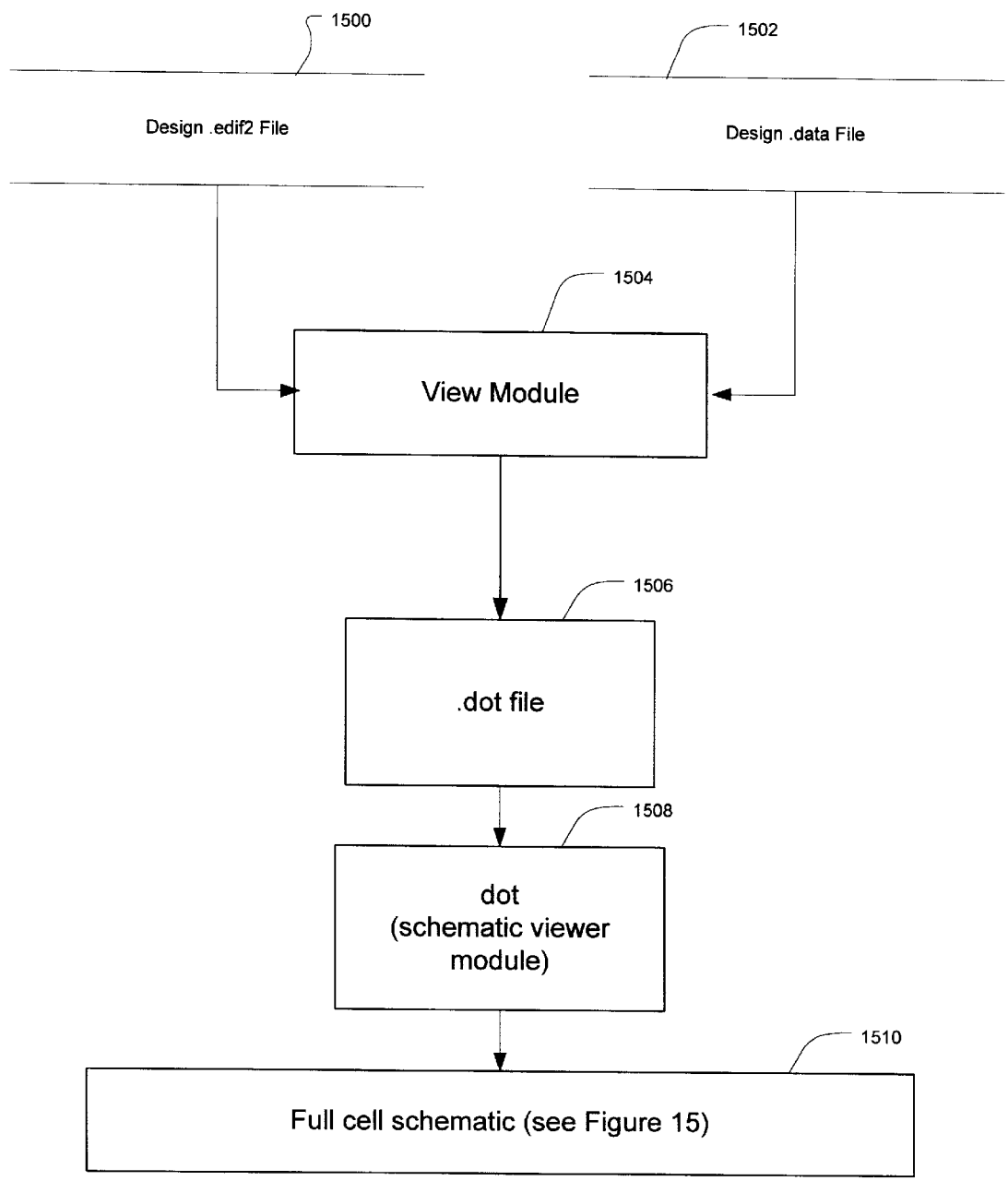
FIG. 14 is a data diagram of a View module executed in accordance with the present invention.
Figure 15:
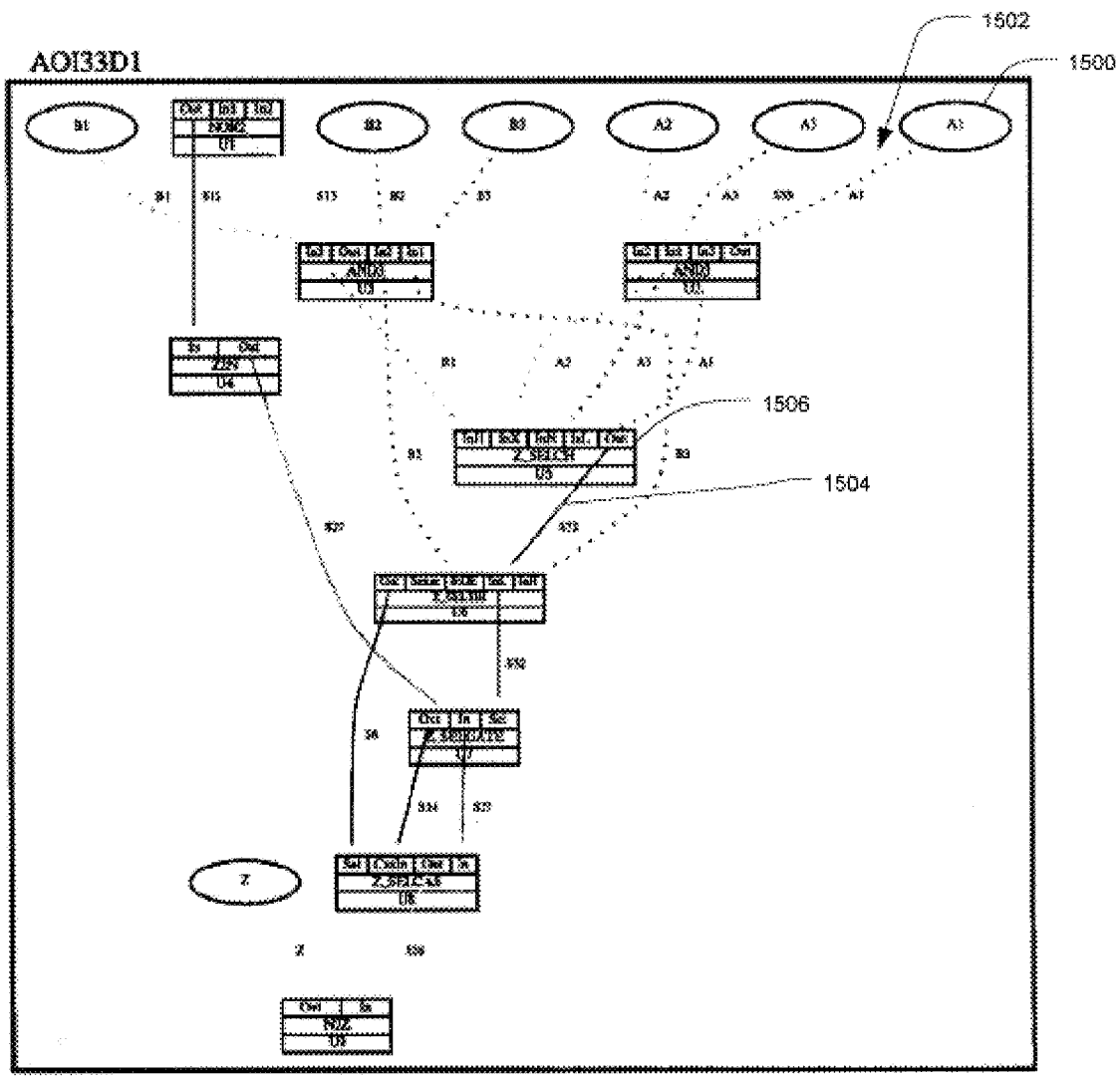
FIG. 15 is an example of a full cell schematic from FIG. 14 produced in accordance with the present invention.

FIG. 14 depicts a data diagram of a View module 1404 executed on a specified library cell defined in .edif2 file 1500 and data file 1502. View module 1504 generates .dot file 1506 that specifies the component instances, ports, and signals in the specified library cell. The dot schematic viewer module displays a graphical schematic representation 1410 of the specified library cell. The graphical representation displays primary ports as elliptical bubbles (e.g., see 1500 in FIG. 15). Connections from primary ports are represented by dotted lines (e.g., see 1502 in FIG. 15). Connections between component instances are represented by solid lines (e.g., see 1504 in FIG. 15). Global ports (e.g., VCC, VDD, VSS or GND) are represented by inverted triangles (not shown). Each component instance is represented by a block (e.g., see 1506 in FIG. 15) having component ports displayed along the top edge, the name of the primitive displayed in the middle of the block, and the name of the particular instance displayed at the bottom of the block. Each signal line interconnecting ports of component instances is uniquely colored (i.e., colored differently than other signal lines) to assist in reading the schematic. FIG. 15 is an example of the full cell schematic from FIG. 14 based on an AOI33D1 library cell.

Figure 16:
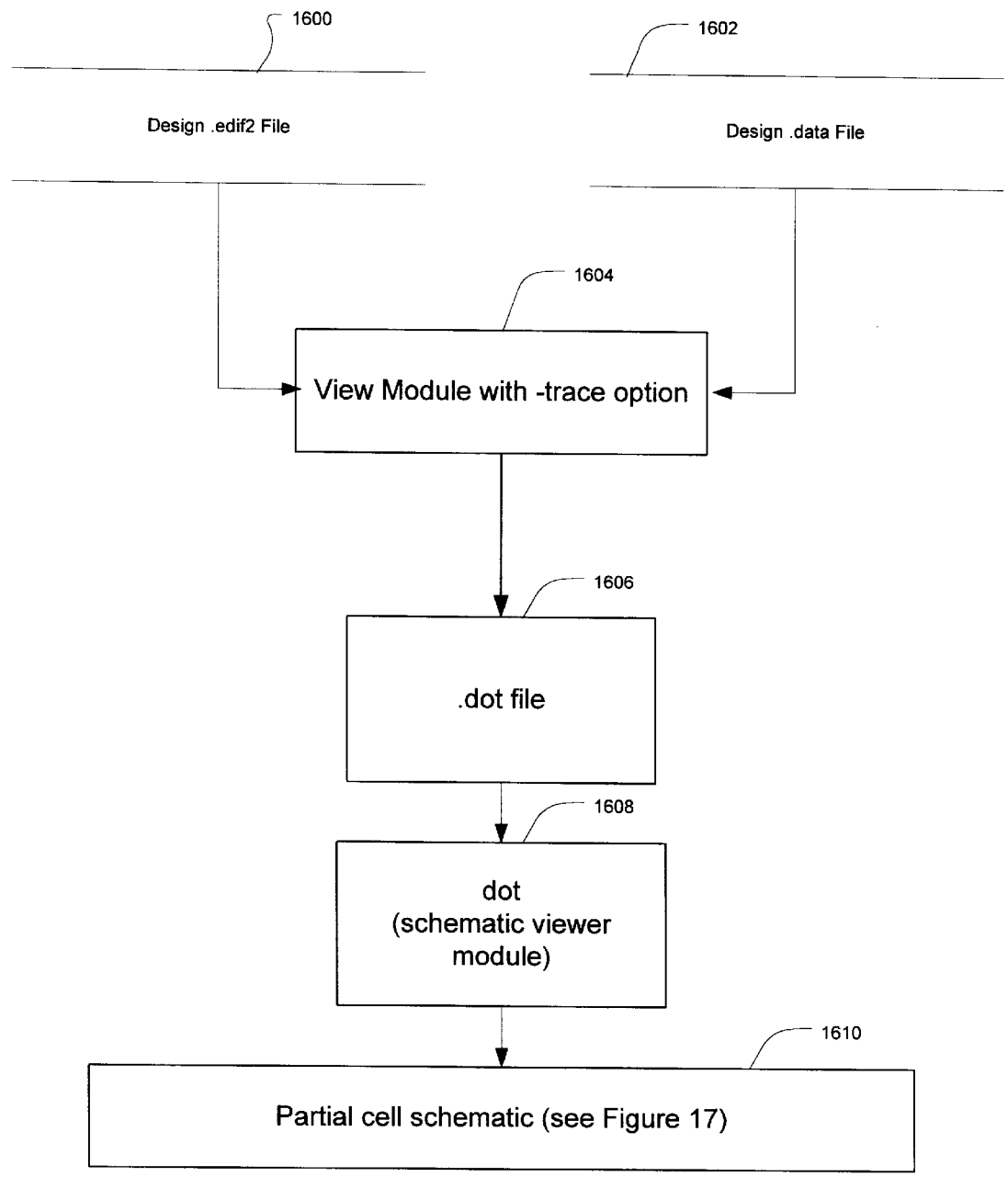
FIG. 16 is a data diagram of a View module executed with a -Trace option in accordance with the present invention.
Figure 17:
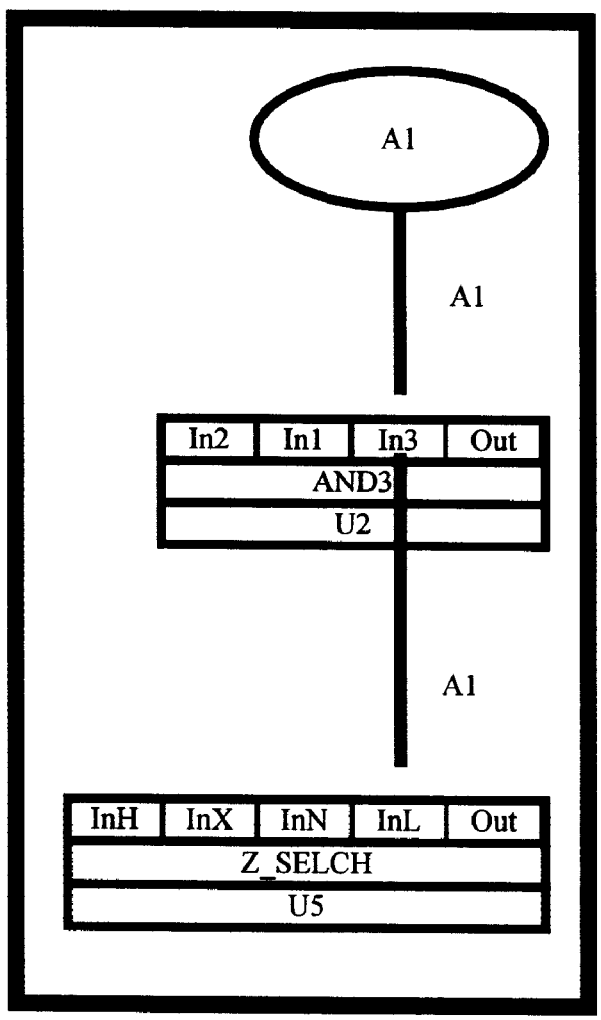
FIG. 17 is an example of a partial cell schematic of FIG. 16 produced in accordance with the present invention.

FIG. 16 depicts a data diagram of a View module 1604 executed on a specified library cell defined in .edif2 file 1600 and .data file 1602. View module 1604 generates .dot file 1606 that specifies the component instances, ports, and signals in the specified library cell. The -Trace option allows a user to specify a signal, primary port, or global port parameter, which causes the View module to display only the specified signal or port and those instances and ports connected to the specified signal or port. The dot schematic viewer module displays a graphical schematic representation 1610 of a portion of the specified library cell. FIG. 17 is an example of the partial cell schematic from FIG. 16 based on an AOI33D1 library cell, where the signal "A1" is the specified signal.

Moreover, while there have been described herein the principles of the present invention in conjunction with a specific implementation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein.

Although claims have been formulated in this application to particular combinations of features, it should be understood that the scope of the disclosure herein also includes any novel feature or any novel combination of features disclosed either explicitly or implicitly for any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived thereof.

What is claimed is:

1. A method of extracting and representing a circuit design comprising the steps of:
   (a) receiving as input a netlist file;
   (b) extracting hierarchical circuit design information from the netlist file; (b1) translating the circuit design information into a user-readable format; and
   (c) generating as output a user-readable data file from the translated circuit design information wherein the user-readable data file is a textual or graphical representation of instances of component cells and internal net connections.

2. The method of claim 1 wherein the netlist file is in electronic design interchange format (EDIF).

3. The method of claim 1 further comprising the step of (d) generating a dot file from the user-readable data file.

4. The method of claim 1 further comprising the step of (d) displaying a user-readable list of component instances and internal net connections of a selected library cell from the user-readable data file.

5. The method of claim 4 wherein the user-readable list comprises a cell name, primary port names, primary port signal directions, and internal pin connections.

6. The method of claim 1 further comprising the step of (d) displaying a user-readable list of a technology netlist of library cell instances from the user-readable data file.

7. The method of claim 1 further comprising the step of (d) displaying a user-readable list of a design netlist of non-library cell instances from the user-readable data file.

8. The method of claim 1 further comprising the step of (d) displaying a user-readable list of a Vigen netlist of non-library cell instances from the user-readable data file.

9. The method of claim 1 further comprising the step of (d) displaying original names and translated names of cell instances from the user-readable data file.

10. The method of claim 1 further comprising the step of (d) displaying a user-readable list of a design netlist of non-library cell instances at or below a specified hierarchical level from the user-readable data file.

11. The method of claim 1 further comprising the step of (d) generating an output EDIF file from the user-readable data file.

12. The method of claim 11 further comprising the step of (e) restoring information to the output EDIF file to generate a complete netlist.

13. The method of Claim 1 further comprising the step of (d) locating a specific cell instance from the user-readable data file.

14. The method of claim 1 further comprising the step of (d) displaying cell instances, primitives, and pin connections that are connected to a selected signal.

15. A computer program product comprising:
   a medium for embodying a computer program for input to a computer; and
   a computer program embodied in the medium for causing the computer to perform the following functions:
   (a) receiving as input a netlist file;
   (b) extracting hierarchical circuit design information from the netlist file; (b1) translating the circuit design information into a user-readable format; and
   (c) generating as output a user-readable data file from the translated circuit design information wherein the user-readable data file is a textual or graphical representation of instances of component cells and internal net connections.

16. The computer program product of claim 15 wherein the netlist file is in electronic design interchange format (EDIF).

17. The computer program product of claim 15 further comprising the step of (d) generating a dot file from the user-readable data file.

18. The computer program product of claim 15 further comprising the step of (d) displaying a user-readable list of component instances and internal net connections of a selected library cell from the user-readable data file.

19. The computer program product of claim 18 wherein the user-readable list comprises a cell name, primary port names, primary port signal directions, and internal pin connections.

20. The computer program product of claim 15 further comprising the step of (d) displaying a user-readable list of a technology netlist of library cell instances from the user-readable data file.

21. The computer program product of claim 15 further comprising the step of (d) displaying a user-readable list of a design netlist of non-library cell instances from the user-readable data file.

22. The computer program product of claim 15 further comprising the step of (d) displaying a user-readable list of a Vigen netlist of non-library cell instances from the user-readable data file.

23. The computer program product of claim 15 further comprising the step of (d) displaying original names and translated names of cell instances from the user-readable data file.

24. The computer program product of claim 15 further comprising the step of (d) displaying a user-readable list of a design netlist of non-library cell instances at or below a specified hierarchical level from the user-readable data file.

25. The computer program product of claim 15 further comprising the step of (d) generating an output EDIF file from the user-readable data file.

26. The computer program product of claim 25 further comprising the step of (e) restoring information to the output EDIF file to generate a complete netlist.

27. The computer program product of claim 15 further comprising the step of (d) locating a specific cell instance from the user-readable data file.

28. The computer program product of claim 15 further comprising the step of (d) displaying cell instances, primitives, and pin connections that are connected to a selected signal.

* * * * *